(12) United States Patent
Choi et al.

(10) Patent No.: US 9,099,662 B2
(45) Date of Patent: Aug. 4, 2015

(54) SUBSTRATE AND DISPLAY DEVICE INCLUDING THE SAME

(71) Applicant: Samsung Display Co., Ltd., Yongin, Gyeonggi-Do (KR)

(72) Inventors: Sang-Jun Choi, Yongin (KR); Won-Duk Jung, Yongin (KR); Jeong-Lim Nam, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 37 days.

(21) Appl. No.: 13/829,953

(22) Filed: Mar. 14, 2013

(65) Prior Publication Data

US 2014/0140015 A1 May 22, 2014

(30) Foreign Application Priority Data

Nov. 19, 2012 (KR) .................. 10-2012-0131189

(51) Int. Cl.
*H05K 7/02* (2006.01)
*H01L 51/00* (2006.01)
*H01L 27/12* (2006.01)

(52) U.S. Cl.
CPC ........ *H01L 51/0097* (2013.01); *H01L 27/1218* (2013.01); *Y02E 10/549* (2013.01); *Y10T 428/264* (2015.01); *Y10T 428/265* (2015.01)

(58) Field of Classification Search
CPC ....... H05K 7/02; G03F 7/0755; G03F 7/0757; G03F 7/094
USPC ............................ 361/748; 428/335, 336, 447
See application file for complete search history.

(56) References Cited

U.S. PATENT DOCUMENTS

| 7,371,433 | B2 * | 5/2008 | Tashiro | 427/387 |
|---|---|---|---|---|
| 7,678,529 | B2 * | 3/2010 | Ogihara et al. | 430/270.1 |
| 7,759,735 | B2 * | 7/2010 | Maekawa | 257/347 |
| 7,968,146 | B2 * | 6/2011 | Wagner et al. | 427/248.1 |
| 8,003,420 | B2 * | 8/2011 | Maekawa | 438/34 |
| 2006/0186413 | A1 * | 8/2006 | Sakakura et al. | 257/72 |
| 2006/0228974 | A1 * | 10/2006 | Thelss et al. | 445/24 |
| 2008/0157065 | A1 * | 7/2008 | Krishnamoorthy et al. | 257/40 |
| 2008/0199805 | A1 * | 8/2008 | Rushkin et al. | 430/270.1 |
| 2009/0142694 | A1 * | 6/2009 | Karkkainen et al. | 430/270.1 |
| 2009/0206732 | A1 * | 8/2009 | Seo et al. | 313/504 |
| 2010/0040895 | A1 * | 2/2010 | Hamada et al. | 428/448 |
| 2011/0111340 | A1 * | 5/2011 | Karkkainen et al. | 430/270.1 |
| 2011/0171447 | A1 * | 7/2011 | Krishnamoorthy et al. | 428/220 |
| 2012/0027984 | A1 * | 2/2012 | Wagner et al. | 428/76 |
| 2012/0052293 | A1 * | 3/2012 | Poe et al. | 428/336 |
| 2012/0132917 | A1 * | 5/2012 | Lee et al. | 257/59 |
| 2013/0140272 | A1 * | 6/2013 | Koole et al. | 216/38 |
| 2014/0184949 | A1 * | 7/2014 | Yim et al. | 349/12 |
| 2014/0217395 | A1 * | 8/2014 | Facchetti et al. | 257/43 |

FOREIGN PATENT DOCUMENTS

| JP | 2002304949 A | * | 10/2002 |
|---|---|---|---|
| KR | 10-2005-0073855 A | | 7/2005 |
| KR | 10-2008-0101488 A | | 11/2008 |
| KR | 10-2009-0074853 A | | 7/2009 |
| KR | 10-2012-0012891 A | | 2/2012 |
| WO | WO 2010036049 A2 | * | 4/2010 |

* cited by examiner

*Primary Examiner* — Jeremy C Norris
*Assistant Examiner* — Nathan Milakovich
(74) *Attorney, Agent, or Firm* — Knobbe Martens Olson & Bear LLP

(57) ABSTRACT

In an aspect, a substrate for a display device that includes a plastic substrate and a planarization layer is provided.

16 Claims, 2 Drawing Sheets

SUBSTRATE AND DISPLAY DEVICE INCLUDING THE SAME

CROSS-REFERENCE TO RELATED APPLICATION

This application claims priority to and the benefit of Korean Patent Application No. 10-2012-0131189, filed on Nov. 19, 2012 in the Korean Intellectual Property Office the disclosure of which is incorporated herein by reference in its entirety.

BACKGROUND

1. Field

The present disclosure relates to a substrate and a display device including the substrate.

2. Description of the Related Technology

A display device such as an organic light emitting device and a liquid crystal display (LCD) may include a substrate.

The substrate for a display device may in general include a glass substrate, a plastic substrate, or the like.

However, a glass substrate may be damaged by an external impact as well as have a limit in achieving a portable display and a large screen since the glass substrate is heavy and fragile. Thus, it may not be appropriate to include in a flexible display device.

The plastic substrate may have an advantage of portability, safety, and lightness when compared with a glass substrate. In addition, since the plastic substrate is fabricated through deposition or printing, manufacturing cost may be lowered. Since a display device including the plastic substrate may be fabricated in a roll-to-roll process rather than a conventional sheet unit process, it may be produced in high volume with a low cost.

However, there may be disadvantages to using a plastic substrate in a display device. For example, the plastic substrate may be deteriorated due to permeability and oxygen transmission of a plastic material and thermal decomposition at a high temperature due to weak heat resistance having a negative influence on a device.

SUMMARY

Some embodiments provide a substrate for a display device. In some embodiments the display device may have improved reliability where defects such as scratches on a surface of a plastic substrate are reduced or eliminated.

Some embodiments provide a display device including a substrate, and a planarization layer located on the substrate.

Some embodiments provide a substrate for a display device that includes a plastic substrate; and a planarization layer located on one side of the plastic substrate where the planarization layer includes a silicon-containing polymer.

In some embodiments, the plastic substrate may include polyimide.

In some embodiments, the silicon-containing polymer may be made from a compound that forms a thin layer having a Si—O bond after undergoing heat treatment of a compound. In some embodiments, the silicon-containing polymer may be made from a compound that provides a thin layer having a Si—O bond after undergoing heat treatment. In some embodiments, the compound may be a polymer represented by Chemical Formula 1, Chemical Formula 2, Chemical Formula 3, or Chemical Formula 4, or any mixture thereof.

In some embodiments, the silicon-containing polymer may include polysiloxane, polysilazane, polysilsesquioxane, a derivative thereof, a copolymer thereof, or a combination thereof. In some embodiments, the compound may include polysiloxane, polysilazane, polysilsesquioxane, a derivative thereof, a copolymer thereof, or a combination thereof.

In some embodiments, the silicon-containing polymer may have an average molecular weight (Mw) of about 2,000 to about 15,000. In some embodiments, the compound may have an average molecular weight (Mw) of about 2,000 to about 15,000.

In some embodiments, the planarization layer may have a thickness of about 1 μm to about 10 μm.

Some embodiments provide a display device that includes a substrate for a display device; a thin film transistor located on the substrate for a display device; and a pixel electrode that is electrically connected to the thin film transistor; wherein the substrate for a display device includes a plastic substrate; and planarization layer located on one side of the plastic substrate where the planarization layer includes a silicon-containing polymer.

In some embodiments, the display device may further include a common electrode facing the pixel electrode; and an emission layer located between the pixel electrode and the common electrode.

In some embodiments, the plastic substrate may include a polyimide.

In some embodiments, a planarization layer may be located on the plastic substrate. In some embodiments, the planarization layer may be a thin layer having a Si—O bond. In some embodiments, the thin layer having a Si—O bond may be produced by coating a compound on the plastic substrate followed by heat treatment. In some embodiments, the compound may include polysiloxane, polysilazane, polysilsesquioxane, a derivative thereof, a copolymer thereof, or a combination thereof. In some embodiments, the compound may be a polymer represented by Chemical Formula 1, Chemical Formula 2, Chemical Formula 3, or Chemical Formula 4, or any mixture thereof.

In some embodiments, the silicon-containing polymer may include polysiloxane, polysilazane, polysilsesquioxane, a derivative thereof, a copolymer thereof, or a combination thereof.

In some embodiments, the silicon-containing polymer may have a weight average molecular weight (Mw) of about 2,000 to about 15,000. In some embodiments, the compound may have a weight average molecular weight (Mw) of about 2,000 to about 15,000.

In some embodiments, the planarization layer may have a thickness of about 1 μm to about 10 μm.

In some embodiments, the display device may further include a buffer layer located on one side of the planarization layer.

DETAILED DESCRIPTION

Figure 1:
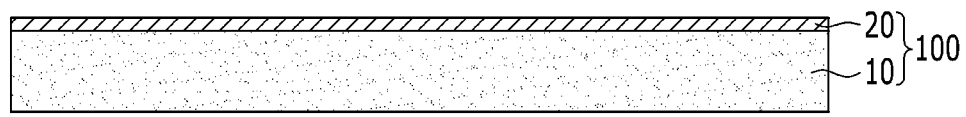
FIG. 1 is a cross-sectional view schematically showing a substrate for a display device according to one embodiment.

Hereinafter, the present disclosure will be described more fully with reference to the accompanying drawings, in which exemplary embodiments of this disclosure are shown. This disclosure may, however, be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, illustrated is a substrate for a display device according to one embodiment referring to FIG. 1.

FIG. 1 is a cross-sectional view schematically illustrating a substrate for a display device according to one embodiment.

The substrate for a display device 100 according to one embodiment may include a plastic substrate 10 and a planarization layer 20 located on plastic substrate 10.

In some embodiments, the plastic substrate 10 has flexible properties.

In some embodiments, the plastic substrate 10 may be made of a polymer having excellent heat resistance and durability. For example, plastic substrate 10 may include polyimide, polyacrylate, polyethyleneetherphthalate, polyethylenenaphthalate, polycarbonate, polyarylate, polyetherimide, polyethersulfone, triacetic acid cellulose, polyvinylidene chloride, polyvinylidene fluoride, an ethylene-vinylalcohol copolymer, or a combination thereof.

In some embodiments, the plastic substrate 10 may include polyimide. In some embodiments, the polyimide may have excellent mechanical strength and heat resistance. In some embodiments, the polyimide may prevent the plastic substrate 10 from being stretched down due to its weight and thermally transformed during post-process handling at a high temperature stabilizing function of the substrate.

In some embodiments, the planarization layer 20 is formed on the plastic substrate 10 and may protect the surface of the plastic substrate 10 from getting damaged due to thermal and mechanical impacts applied during post-process handling. In some embodiments, the planarization layer 20 may prevent a shape deformation such as a particle, a protrusion, a scratch, and the like on the surface of the plastic substrate 10 during the post-process handling and resultantly, increase reliability of a device.

In some embodiments, the planarization layer 20 may be formed using a solution and thus, may fill a defect such as a scratch and a crack on the surface of the plastic substrate 10 and cover a protrusion thereon. In some embodiments, the planarization layer 20 has a predetermined thickness and thus, may block oxygen and moisture from contacting the plastic substrate 10 and protect a thin film transistor (TFT) and an electron device from exposure to the oxygen and moisture.

In some embodiments, the planarization layer 20 may include a silicon-containing polymer.

In some embodiments, a thin layer having a Si—O bond may be produced by coating a compound on the plastic substrate followed by heat treatment.

In some embodiments, the silicon-containing polymer may be polysiloxane, polysilazane, polysilsesquioxane, a derivative thereof, a copolymer thereof, or a combination thereof. In some embodiments, the silicon-containing polymer may have a cross-linking group such as a hydroxyl group, a methoxy group, and the like at its side chain. In some embodiments, the compound may be a polymer represented by Chemical Formula 1, Chemical Formula 2, Chemical Formula 3, or Chemical Formula 4, or any mixture thereof.

In some embodiments, the silicon-containing polymer may have high close contacting property with a polymer comprising the plastic substrate 10, for example, the polyimide and thus, may prevent the planarization layer 20 from being detached or delaminated.

In some embodiments, the silicon-containing polymer may be a hydrophobic and insulating polymer and thus, may effectively prevent a short circuit occurring during the module process and operation as well as block external inflow of moisture.

In some embodiments, the silicon-containing polymer may have high heat resistance and thus, may not be thermally decomposed despite exposure to a high temperature during the post-process handling, for example, PECVD (plasma enhanced chemical vapor deposition).

In some embodiments, the silicon-containing polymer may have a weight average molecular weight (Mw) of about 2,000 to about 15,000. In some embodiments, the polymer characteristic and the coating property of a planarization layer may simultaneously be accomplished when the silicon-containing polymer has a weight average molecular weight (Mw) within the range of about 2,000 to about 15,000. In some embodiments, the polymer may have a weight average molecular weight (Mw) of about 3,000 to about 10,000. In some embodiments, the compound may have a weight average molecular weight (Mw) of about 3,000 to about 10,000.

In some embodiments, the planarization layer 20 may have a thickness of about 1 μm to about 10 μm. In some embodiments, the planarization layer 20 may have a thickness of about 3 μm to about 5 μm.

In some embodiments, the planarization layer 20 may prevent external inflow of oxygen and moisture, a short circuit, or outgassing and simultaneously, thermal distortion due to excessive thickness during the process when the planarization layer 20 has a thickness within a range of about 1 μm to about 10 μm. Hereinafter, a method of manufacturing the substrate for a display device 100 according to one embodiment is illustrated.

In some embodiments, the method of manufacturing the substrate for a display device includes preparing a plastic substrate, supplying the plastic substrate with a silicon-containing polymer solution, and curing the silicon-containing polymer solution.

In some embodiments, the silicon-containing polymer solution may include polysiloxane, polysilazane, polysilsesquioxane, a derivative thereof, a copolymer thereof, or a combination thereof and additionally, an additive, for example, a curing initiator, a coupling agent, and a solvent.

In some embodiments, supplying the silicon-containing polymer solution may include a solution process such as spincoating, slitcoating, screen-printing, inkjet, ODF (one drop filling), or a combination thereof.

In some embodiments, the curing of the silicon-containing polymer solution may include natural curing, thermal curing, photo-curing, plasma curing, pressure-humidifying curing, or a combination thereof. In some embodiments, the thermal curing may be performed at a temperature ranging from about 150° C. to about 500° C. In some embodiments, the curing may include primary curing and secondary curing performed at a higher temperature than the primary curing. In some embodiments, the primary curing may be performed at a temperature ranging from about 200° C. to about 300° C., and the secondary curing may be performed at a temperature ranging from about 300° C. to about 450° C.

In some embodiments, the curing may form the silicon-containing polymer into a thin layer having a Si—O bond.

Figure 2:
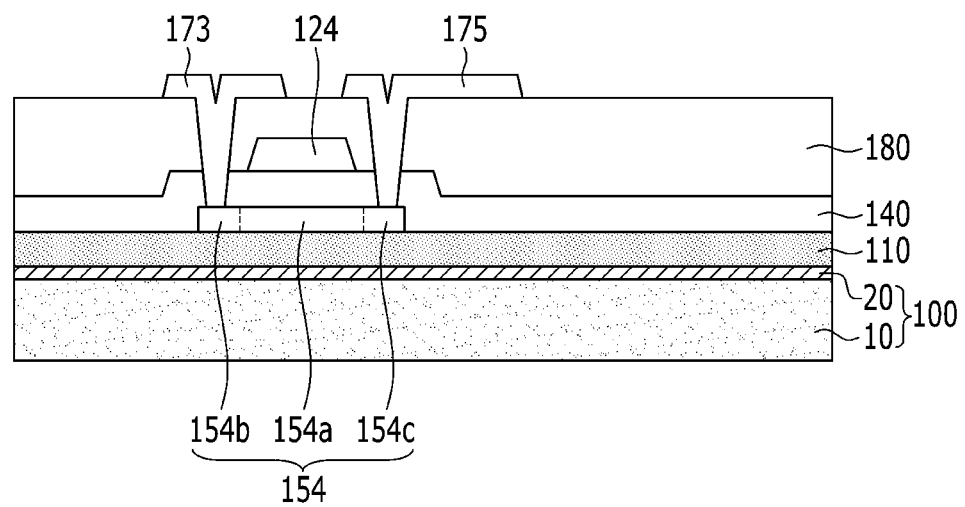
FIG. 2 is a cross-sectional view of a display device according to one embodiment.

Referring to FIG. 2, a display device using the substrate for a display device is described.

FIG. 2 is a cross-sectional view showing a display device.

The display device according to one embodiment includes the substrate 100.

In some embodiments, the substrate 100 includes the plastic substrate 10 and the planarization layer 20 located on the plastic substrate 10, and the planarization layer 20 may be formed of a silicon-containing polymer.

In some embodiments, a buffer layer 110 is formed on the substrate 100. In some embodiments, the buffer layer 110 may be formed of an inorganic material on one surface of the substrate 110 and block external transmission of moisture and oxygen. In some embodiments, the inorganic material may be made of oxide, nitride, or oxynitride, for example, oxide of a semi-metal such as silicon (Si), oxide, nitride, or oxynitride of a metal such as titanium (Ti), tantalum (Ta), aluminum (Al), and the like, or a combination thereof.

In some embodiments, the buffer layer 110 may be a single layer or multilayer. In some embodiments, the buffer layer 110 may be a single layer formed of silicon oxide or silicon nitride, a double layer formed of silicon oxide/silicon nitride, or a triple layer formed of silicon oxide/silicon nitride/silicon oxide but is not limited thereto.

In some embodiments, the buffer layer 110 may be deposited on the substrate 100 at a temperature ranging from about 50° C. to about 650° C. using a PECVD method.

In some embodiments, the planarization layer 20 is a thin layer having a Si—O bond as aforementioned and may replace a part or whole of the buffer layer 110. Accordingly, the buffer layer 110 may have a small number of layers or may be omitted.

In some embodiments, a semiconductor layer 154 may be formed on the substrate 100. In some embodiments, the semiconductor layer 154 may include a non-doped channel region 154a, a source region 154b doped with impurities, and a drain region 154c. In some embodiments, the semiconductor layer 154 may include amorphous silicon, polysilicon, an organic semiconductor, an oxide semiconductor, or a combination thereof.

In some embodiments, a gate insulating layer 140 may be formed on the semiconductor layer 154. In some embodiments, the gate insulating layer 140 may be formed on the whole of the substrate 100 and may be formed of an inorganic material such as silicon oxide or silicon nitride or an organic material such as polyvinylalcohol. In some embodiments, the gate insulating layer 140 may have contact holes that correspondingly reveal the source region 154b and the drain region 154c.

In some embodiments, a gate electrode 124 is formed on the gate insulating layer 140. In some embodiments, the gate electrode 124 may be positioned to overlap the channel region 154a in the semiconductor layer 154.

In some embodiments, a passivation layer 180 may be formed on a gate electrode 124. In some embodiments, the passivation layer 180 has a contact hole that correspondingly reveals the source region 154b and the drain region 154c.

In some embodiments, a source electrode 173 and a drain electrode 175 are located on the passivation layer 180. In some embodiments, the semiconductor layer 154 may include polycrystalline silicon. In some embodiments, the source electrode 173 may be electrically connected to the source region 154b of polycrystalline silicon layer 154 through the contact hole on the passivation layer 180 and the gate insulating layer 140. In some embodiments, the drain electrode 175 may be electrically connected to the drain region 154c of polycrystalline silicon layer 154 through the contact hole on the passivation layer 180 and the gate insulating layer 140.

In some embodiments, the semiconductor layer 154, gate electrode 124, source electrode 173, and drain electrode 175 form a thin film transistor (TFT).

A pixel electrode (not shown) is formed on the thin film transistor. In some embodiments, the pixel electrode may be electrically connected to the thin film transistor.

When the display device is an organic light emitting device, it may further include a common electrode (not shown) facing with the pixel electrode and an emission layer (not shown) between the pixel electrode and the common electrode.

Herein, at least one of the pixel electrode and the common electrode may be a transparent electrode. When the pixel electrode is a transparent electrode, it emits a light toward the substrate 100 (bottom emission), and when the common electrode is a transparent electrode, a light is emitted toward the opposite side of the substrate 100 (top emission)

In addition, when the pixel electrode and the common electrode are all transparent electrodes, a light may be emitted toward the substrate and the opposite side of the substrate at the same time.

When the display device is a liquid crystal display (LCD), the liquid crystal display may further include another substrate (not shown) facing the substrate 100. The facing substrate may include a common electrode, a color filter, and the like. In addition, liquid crystal is interposed between the substrate 100 and the facing substrate.

The following examples illustrate the present embodiments in more detail. These examples, however, are not in any sense to be interpreted as limiting the scope of the present embodiments.

Manufacture of Substrate for Display Device

Example 1

A polyethylene terephthalate (PET) film was attached to a glass plate as a carrier, and then, an about 50 μm-thick polyimide film was attached thereon.

Next, a polymer solution was prepared by dissolving 15 g of a polymer represented by Chemical Formula 1 (a weight average molecular weight=4,500) and 3 g of tris[3-(trimethoxysilyl)propyl]isocyanurate as a cross-linking agent in 85 g of propyleneglycol monomethylether acetate (PGMEA), coated to be about 4 um thick on the plastic substrate in a slitcoating method, and heat-treated at 250° C. for 5 minutes.

Then, the heat-treated product was additionally heat-treated at 450° C. for 45 minutes to cure the polymer to form a planarization layer, fabricating a substrate for a display device including the planarization layer.

Chemical Formula 1

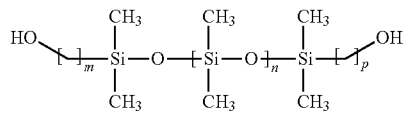

(m and p are integers of 0 or more, and n is an integer of 1 or more)

Example 2

A substrate having a planarization layer for a display device was fabricated according to the same method as Example 1 except for using a polymer represented by Chemical Formula 2 (weight average molecular weight=3,500) instead of the polymer represented by the above formula 1.

Chemical Formula 2

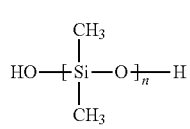

(n is an integer of 1 or more)

Example 3

A substrate having a planarization layer for a display device was according to the same method as Example 1 except for using 4.5 g of the cross-linking agent.

Example 4

A substrate having a planarization layer for a display device was fabricating according to the same method as Example 1 except for using a polymer represented by Chemical Formula 3 (a weight average molecular weight=3,500) instead of the polymer represented by Chemical Formula 1 and 3-bis(3-glycidyloxypropyl)tetramethyldisioxane as a cross-linking agent.

Chemical Formula 3

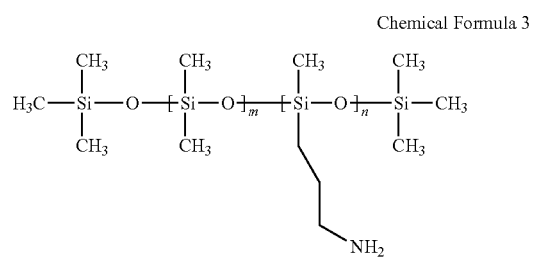

(m and n are integers of 1 or more)

Example 5

A substrate including a planarization layer for a display device was fabricated according to the same method as Example 4 except for using a polymer represented by Chemical Formula 4 (a weight average molecular weight=3,500) instead of the polymer represented by Chemical Formula 3.

Chemical Formula 4

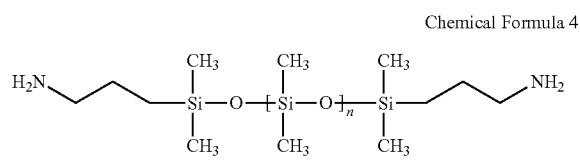 [SMILES: C[Si](C)(CCCN)O[Si](C)(C)O[Si](C)(C)CCCN]

(n is an integer of 1 or more)

Comparative Example 1

A substrate for a display device was fabricated according to the same method as Example 1 except for forming no planarization layer.

Evaluation 1

Roughness Measurement Result

The substrates according to Examples 1 to 5 and Comparative Example 1 were measured regarding surface roughness using AFM (Atomic Force Microscope). The results are provided in Table 1.

TABLE 1

|  | Surface roughness of substrate for a display device (rms) |
| --- | --- |
| Example 1 | 2.4 |
| Example 2 | 2.5 |
| Example 3 | 3.5 |
| Example 4 | 3.0 |
| Example 5 | 3.4 |
| Comparative Example 1 | 25 |

Referring to Table 1, the substrates according to Examples 1 to 5 had much less roughness than the one according to Comparative Example 1. Accordingly, the substrates according to Examples 1 to 5 had excellent surface planarization compared with the one according to Comparative Example 1.

Evaluation 2

SEM Photograph of Substrate Surface

The substrates according to Example 1 and Comparative Example were taken a photograph of their surfaces 1 after the additional heat treatment (secondary curing) using a scanning electron microscope (SEM).

Figure 3:
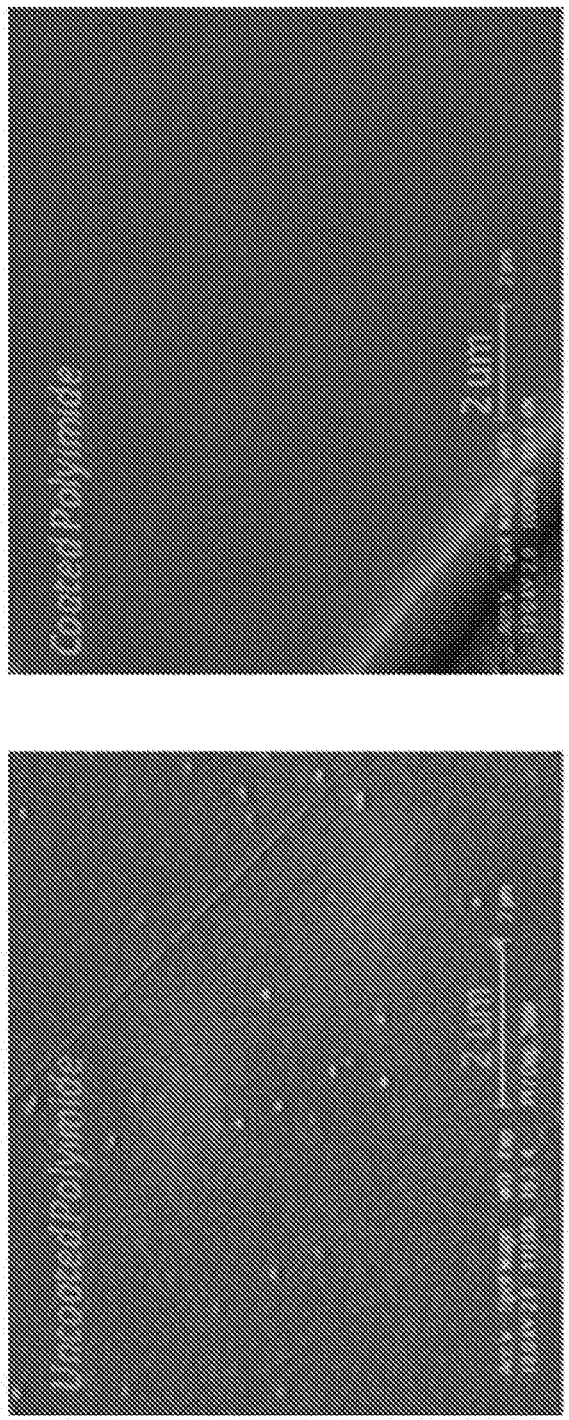
FIG. 3 is enlarged photographs showing surfaces of the substrates for a display device according to Example 1 and Comparative Example 1.

FIG. 3 is an enlarged photograph showing the surfaces of the substrates for a display device according to Example 1 and Comparative Example 1.

Referring to FIG. 3, the substrate for a display device (right) according to Example 1 had a clean surface, while the substrate (left) according to Comparative Example 1 had particles, protrusions, scratches, and the like on the surface.

In the present disclosure, the terms "Example," and "Comparative Example" are used arbitrarily to simply identify a particular example or experimentation and should not be interpreted as admission of prior art. While this disclosure has been described in connection with what is presently considered to be practical exemplary embodiments, it is to be understood that the invention is not limited to the disclosed embodiments and is intended to cover various modifications and equivalent arrangements included within the spirit and scope of the appended claims.

What is claimed is:

1. A substrate for a display device, comprising:
a plastic substrate; and
a planarization layer directly contacting one side of the plastic substrate and including a silicon-containing polymer, wherein the silicon-containing polymer is hydrophobic and the silicon-containing polymer has a weight average molecular weight (Mw) of about 2,000 to about 15,000 and the silicon-containing polymer is made from a compound that provides a thin layer having a Si—O bond after undergoing heat treatment.

2. The substrate for a display device of claim 1, wherein the plastic substrate comprises polyimide.

3. The substrate for a display device of claim 1, wherein the plastic substrate comprises a polyethylene terephthalate (PET) film; and a polyimide film.

4. The substrate for a display device of claim 3, wherein the polyimide film is about 50 μm thick.

5. The substrate for a display device of claim 1, wherein the silicon-containing polymer comprises polysiloxane, polysilazane, polysilsesquioxane, a derivative thereof, a copolymer thereof, or a combination thereof.

6. The substrate for a display device of claim 1, wherein the planarization layer has a thickness of about 1 μm to about 10 μm.

7. A display device comprising:
a substrate for a display device;
a thin film transistor located on the substrate for a display device; and
a pixel electrode that is electrically connected to the thin film transistor;
wherein the substrate for a display device comprises:
a plastic substrate; and
a planarization layer directly contacting one side of the plastic substrate and including a silicon-containing polymer, wherein the silicon-containing polymer is hydrophobic and the silicon-containing polymer has a weight average molecular weight (Mw) of about 2,000 to about 15,000 and the silicon-containing polymer compound is made m a compound that provides a thin layer having a Si—O bond after undergoing heat treatment.

8. The display device of claim 7, further comprising:
a common electrode facing the pixel electrode; and
an emission layer located between the pixel electrode and the common electrode.

9. The display device of claim 7, wherein the plastic substrate comprises a polyimide.

10. The display device of claim 9, wherein the plastic substrate comprises a polyethylene terephthalate (PET) film and a polyimide film.

11. The substrate for a display device of claim 10, wherein the polyimide film is about 50 μm thick.

12. The display device of claim 7, wherein the silicon-containing polymer comprises polysiloxane, polysilazane, polysilsesquioxane, a derivative thereof, a copolymer thereof, or a combination thereof.

13. The display device of claim 7, wherein the planarization layer has a thickness of about 1 μm to about 10 μm.

14. The display device of claim 7, which further comprises a buffer layer located on one side of the planarization layer.

15. The substrate for a display device of claim 5, wherein the silicon-containing polymer comprises poly(dimethylsiloxane).

16. The display device of claim 12, wherein the silicon-containing polymer comprises poly(dimethylsiloxane).

* * * * *